(12) United States Patent
Yamamoto

(10) Patent No.: US 11,081,526 B2
(45) Date of Patent: Aug. 3, 2021

(54) NONVOLATILE MEMORY DEVICE

(71) Applicant: KIOXIA CORPORATION, Tokyo (JP)

(72) Inventor: Kazuhiko Yamamoto, Fujisawa Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 16/803,863

(22) Filed: Feb. 27, 2020

(65) Prior Publication Data

US 2021/0083003 A1 Mar. 18, 2021

(30) Foreign Application Priority Data

Sep. 18, 2019 (JP) .............................. JP2019-169327

(51) Int. Cl.
*H01L 47/00* (2006.01)
*H01L 27/24* (2006.01)
*H01L 45/00* (2006.01)
*H01L 23/528* (2006.01)

(52) U.S. Cl.
CPC .......... *H01L 27/249* (2013.01); *H01L 23/528* (2013.01); *H01L 45/06* (2013.01); *H01L 45/1226* (2013.01); *H01L 45/1253* (2013.01); *H01L 45/141* (2013.01)

(58) Field of Classification Search
CPC ... H01L 27/249; H01L 45/06; H01L 45/1226; H01L 47/00
See application file for complete search history.

(56) References Cited

U.S. PATENT DOCUMENTS

| 5,912,839 | A | 6/1999 | Ovshinsky et al. |
| 7,667,218 | B2 | 2/2010 | Yamamoto et al. |
| 8,829,581 | B1 * | 9/2014 | Wang ..................... H01L 45/12 |
| | | | 257/295 |
| 9,640,757 | B2 * | 5/2017 | Zheng .................. H01L 45/141 |

(Continued)

FOREIGN PATENT DOCUMENTS

| JP | 5940924 B2 | 6/2016 |
| WO | 2017104577 A1 | 6/2017 |

OTHER PUBLICATIONS

Machine translation of Japanese Patent Application No. 2017-556030 filed Dec. 9, 2016, 9 pages.

*Primary Examiner* — Caleb E Henry
(74) *Attorney, Agent, or Firm* — Kim & Stewart LLP

(57) ABSTRACT

According to one embodiment, a nonvolatile memory device includes a first wiring extending in a first direction, a second wiring extending in a second direction, a third wiring extending in the second direction and spaced from the second wiring in the first direction. An insulating layer includes a first portion between the second wiring and the third wiring, and a second portion protruding from the first portion in a third direction. A chalcogenide layer is between the first wiring and the second wiring, the first wiring and the third wiring, and also the first wiring and the insulating layer. The chalcogenide layer includes a first layer portion, a second layer portion, and a third layer portion. A concentration of a first element in the third layer portion is higher than that in the first and second layer portions.

20 Claims, 10 Drawing Sheets

(56) References Cited

U.S. PATENT DOCUMENTS

| | | | |
|---|---|---|---|
| 2006/0113520 A1* | 6/2006 | Yamamoto | H01L 45/1625 257/3 |
| 2006/0131618 A1* | 6/2006 | Hsueh | H01L 21/425 257/246 |
| 2007/0045605 A1* | 3/2007 | Hsueh | H01L 45/1273 257/4 |
| 2007/0158698 A1* | 7/2007 | Dennison | H01L 45/126 257/246 |
| 2009/0075420 A1* | 3/2009 | Bae | H01L 45/1691 438/102 |
| 2009/0230512 A1* | 9/2009 | Baek | H01L 27/249 257/536 |
| 2010/0171087 A1* | 7/2010 | Kurotsuchi | H01L 45/1625 257/2 |
| 2011/0049454 A1* | 3/2011 | Terao | H01L 45/12 257/2 |
| 2011/0079764 A1 | 4/2011 | Nishihara et al. | |
| 2012/0119177 A1* | 5/2012 | Erbetta | H01L 45/144 257/2 |
| 2015/0200308 A1* | 7/2015 | Karda | H01L 45/141 257/329 |
| 2016/0005966 A1* | 1/2016 | Kim | H01L 21/02348 438/127 |
| 2017/0069839 A1* | 3/2017 | Troyan | H01L 45/1253 |
| 2020/0203429 A1* | 6/2020 | Fantini | H01L 45/141 |
| 2020/0350203 A1* | 11/2020 | Fratin | G11C 5/025 |
| 2021/0005665 A1* | 1/2021 | Fantini | H01L 45/1608 |

* cited by examiner

NONVOLATILE MEMORY DEVICE

CROSS-REFERENCE TO RELATED APPLICATION(S)

This application is based upon and claims the benefit of priority from Japanese Patent Application No. 2019-169327, filed Sep. 18, 2019, the entire contents of which are incorporated herein by reference.

FIELD

Embodiments described herein relate generally to a nonvolatile memory device.

BACKGROUND

A nonvolatile memory device in which memory cells including variable resistance memory elements such as phase change memory (PCM) elements can be integrated on a semiconductor substrate. In this context, such a nonvolatile memory device may be referred to as a semiconductor integrated circuit device.

In such a nonvolatile memory device, it is important that electrical insulation between memory cells be certainly achieved.

DETAILED DESCRIPTION

In general, according to one embodiment, a nonvolatile memory device comprises a first wiring extending in a first direction, a second wiring extending in a second direction that intersects with the first direction, and a third wiring extending in the second direction and spaced from the second wiring in the first direction. An insulating layer includes a first portion between the second wiring and the third wiring in the first direction and a second portion protruding from the first portion in a third direction beyond the ends of the second and third wirings in the third direction. The third direction intersects with the first and second directions. A memory film (e.g., a chalcogenide layer) is between the first wiring and the second wiring, between first wiring and the third wiring, and between the first wiring and insulating layer. The memory film includes a first layer portion between the first wiring and the second wiring, a second layer portion between the first wiring and the third wiring, and a third layer portion between the first wiring and the insulating layer. A concentration of a first element in the third layer portion is higher than a concentration of the first element in the first layer portion and also a concentration of the first element in the second layer portion.

Hereinafter, certain example embodiments will be described with reference to the drawings.

Figure 1:
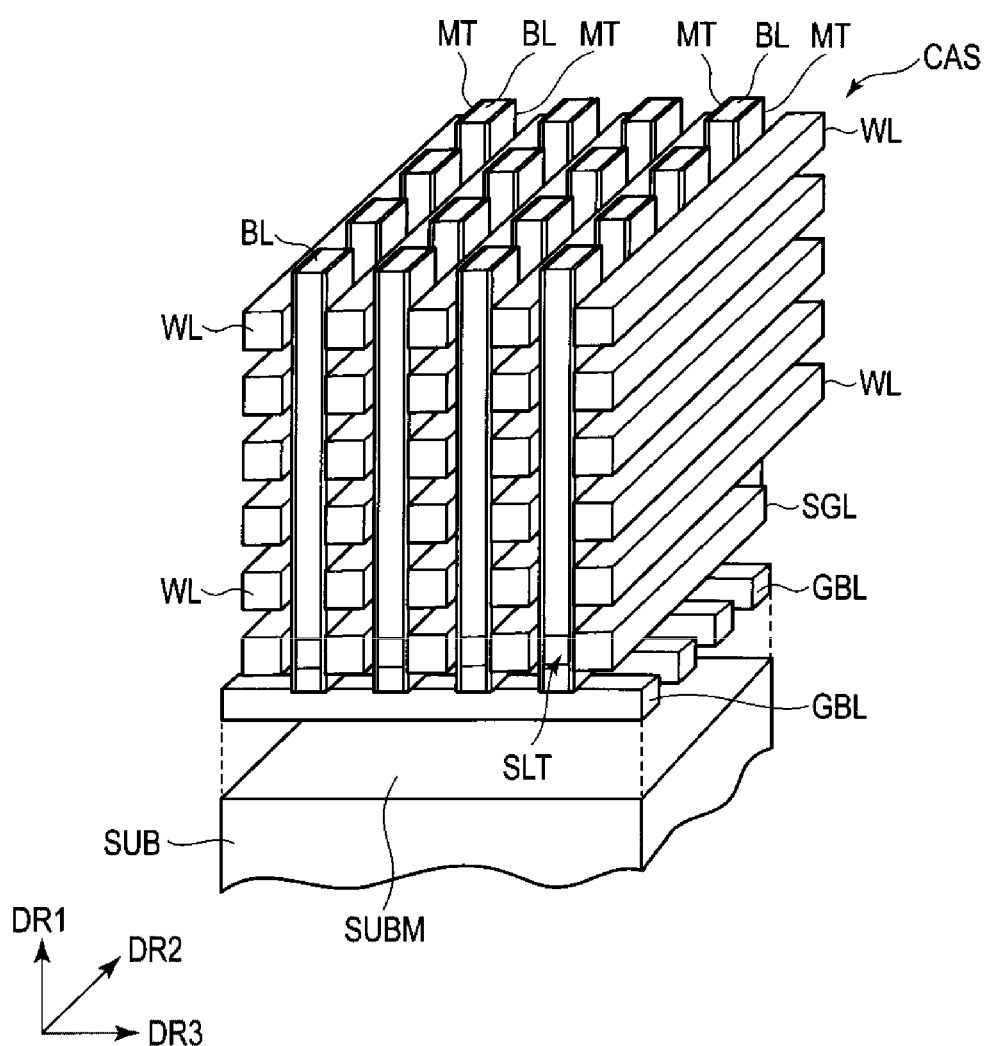
FIG. 1 is a perspective view schematically illustrating a basic configuration of a nonvolatile memory device according to an embodiment.

FIG. 1 is a perspective view schematically illustrating a basic configuration of a nonvolatile memory device according to an embodiment. The nonvolatile memory device is a semiconductor integrated circuit device.

As illustrated in FIG. 1, a cell array structure CAS is provided on a main surface SUBM of a semiconductor substrate SUB. Specifically, the cell array structure CAS comprises a plurality of memory cells that are three-dimensionally arranged. In some context, the cell array structure CAS may be referred to as a stacked body of memory cells, stacked memory cells, or the like.

The cell array structure CAS includes a plurality of bit lines BL, a plurality of word lines WL, and a plurality of chalcogenide material layers MT. On a lower layer side of the cell array structure CAS, a plurality of global bit lines GBL, a plurality of select gate lines SGL, and a plurality of select transistors SLT are provided.

Each of the bit lines BL extends in a first direction DR1 perpendicular to the main surface SUBM of the semiconductor substrate SUB. Each of the word lines WL extends in a second direction DR2 that intersects with the first direction DR1, specifically in the second direction DR2 parallel to the main surface SUBM of the semiconductor substrate SUB. The bit lines BL are arranged in the second direction DR2 and a third direction DR3 that intersects with the first direction DR1 and the second direction DR2. The word lines WL are arranged in the first direction DR1 and the third direction DR3. In this example embodiment, the first direction DR1, the second direction DR2, and the third direction DR3 are perpendicular to one another.

An insulating layer, which is not shown for convenience of the drawings, is provided in a region between the word lines WL and a region between the bit lines BL.

The chalcogenide material layers MT are provided between each of the bit lines BL and a stacked structure including the word lines WL and the insulating layer between the word lines WL. That is, the chalcogenide material layers MT are formed along a surface of the bit lines BL.

The memory cells comprise the chalcogenide material layers MT interposed between the bit lines BL and the word lines WL. The bit lines BL each function as an electrode of connected memory cells, and the word lines WL each function as another electrode of the memory cells.

Figure 2:
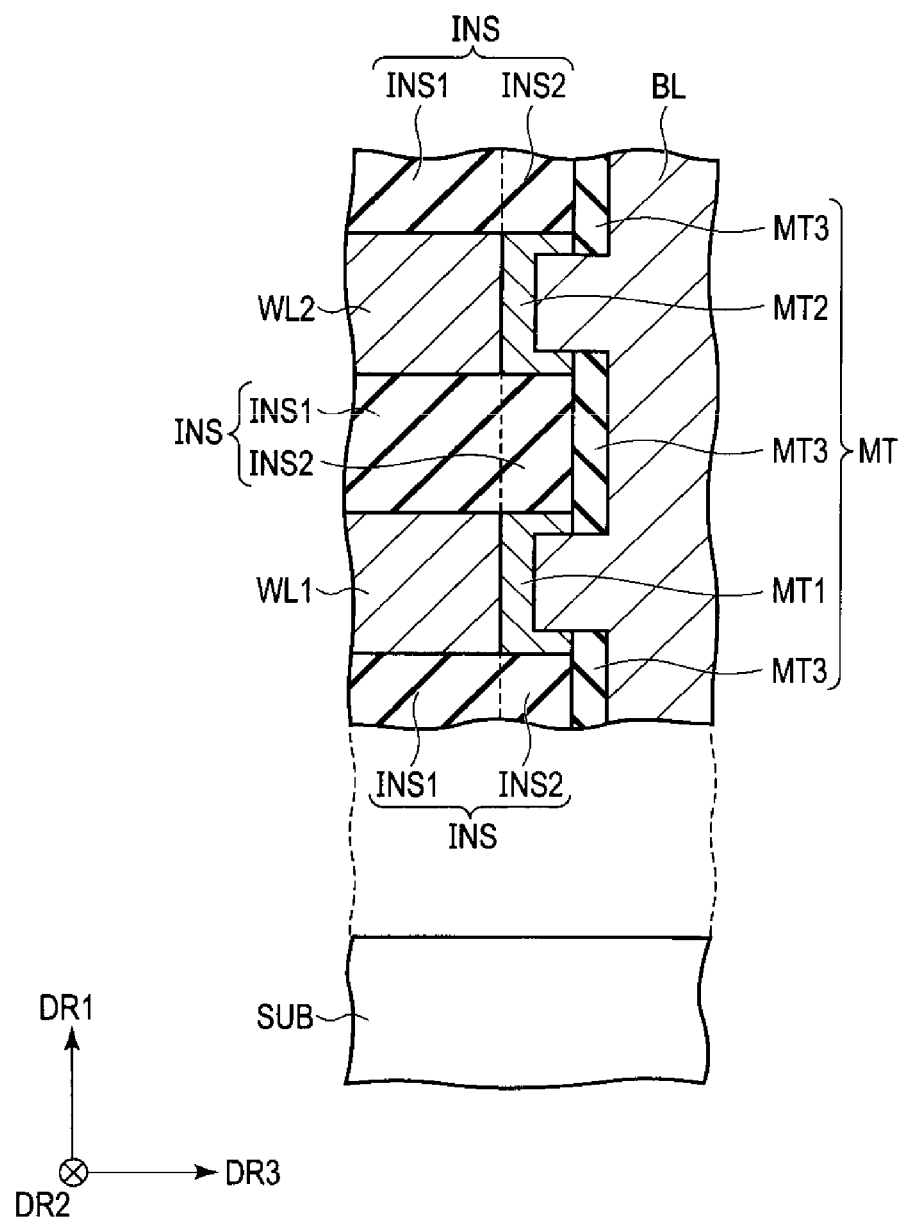
FIG. 2 is a cross-sectional view schematically illustrating a portion of a nonvolatile memory device according to an embodiment.

FIG. 2 is a cross-sectional view schematically illustrating a part of the nonvolatile memory device. In FIG. 2, the word line WL1 is one of the stacked word lines WL depicted in FIG. 1, and the word line WL2 is another word line WL provided above the word line WL1 in the direction DR1.

As illustrated in FIG. 2, each insulating layer INS includes a first insulating portion INS1 disposed between the word line WL1 and the word line WL2, and a second insulating portion INS2 protruding from the first insulating portion INS1 in the third direction DR3. That is, an end side surface of the second insulating portion INS2 protrudes beyond an end side surface of the word line WL1 and an end side surface of the word line WL2 in the third direction DR3.

The chalcogenide material layers MT are formed from a chalcogenide material, and contain at least one element selected from a group consisting of sulfur (S), selenium (Se), and tellurium (Te). For the chalcogenide material layers MT, for example, GeTe, GeSbTe, $Sb_2Te_3$, $SbTe_x$, or the like can be used.

The chalcogenide material layers MT as depicted in FIG. 2 each include a first material layer portion MT1, a second material layer portion MT2, and a third material layer portion MT3. The first material layer portion MT1, the third material layer portion MT3, and the second material layer portion MT2 are continuously provided with each other, that is, these portions are connected to each other without disruption. In the example illustrated in FIG. 2, the chalcogenide material layer MT is provided conformally along a side surface of a stacked structure including the word line WL1, the word line WL2, and the insulating layers INS.

The first material layer portion MT1 is between the bit lines BL and the word line WL1. The first material layer portion MT1 is in contact with the second insulating portions INS2 of the insulating layers INS without protruding beyond an interface between the third material layer portion MT3 and the insulating layer INS in the third direction DR3.

The second material layer portion MT2 is between each of the bit lines BL and the word line WL2. The second material layer portion MT2 is in contact with the second insulating portions INS2 of the insulating layers INS without protruding beyond the interface between the third material layer portion MT3 and the insulating layer INS in the third direction DR3.

The third material layer portion MT3 includes a portion disposed between each of the bit lines BL and the insulating layer INS. A third material portion MT3 connects the first material layer portion MT1 to the second material layer portion MT2.

The third material layer portion MT3 contains a first element. The concentration of the first element in the third material layer portion MT3 is higher than the concentration of the first element in the first material layer portion MT1 and also higher than that in the second material layer portion MT2. The concentration of the first element in the first material layer portion MT1 may be zero in some examples, and the concentration of the first element in the second material layer portion MT2 may also be zero in some examples. That is, the first material layer portion MT1 may contain no (or no appreciable) amount of the first element, and likewise the second material layer portion MT2 may contain no (or no appreciable) amount of the first element. In this example, the first element is selected from a group consisting of argon (Ar), arsenic (As), phosphorus (P), boron (B), carbon (C), germanium (Ge), fluorine (F), nitrogen (N), and oxygen (O).

The third material layer portion MT3 has a higher electrical resistivity than the first material layer portion MT1 and the second material layer portion MT2 since the first element is contained in the third material layer portion MT3 at a higher concentration. More specifically, the third material layer portion MT3 can be considered an insulator material.

The chalcogenide material layers MT contain a second element. Specifically, the second element is a metal element or a semiconductor element. In this example, the second element is selected from a group consisting of aluminum (Al), silicon (Si), titanium (Ti), vanadium (V), chromium (Cr), manganese (Mn), iron (Fe), cobalt (Co), nickel (Ni), copper (Cu), zinc (Zn), yttrium (Y), zirconium (Zr), niobium (Nb), molybdenum (Mo), hafnium (Hf), tantalum (Ta), and tungsten (W).

Figure 3A:
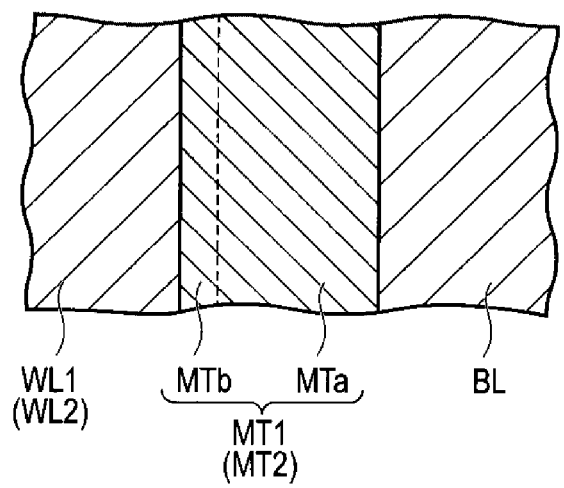
FIG. 3A is a cross-sectional view schematically illustrating as an example configuration of a first material layer portion (or a second material layer portion) of a chalcogenide material layer of a nonvolatile memory device according to an embodiment

FIG. 3A is a cross-sectional view schematically illustrating the first material layer portion MT1 (or the second material layer portion MT2) and its immediate surroundings as illustrated in FIG. 2.

In the first material layer portion MT1, the concentration of the second element is higher in the vicinity of the boundary between the first material layer portion MT1 and the word line WL1. In FIG. 3A, the portion where the concentration of the second element is relatively lower is represented as layer portion MTa, and the portion where the concentration of the second element is relatively higher is represented as layer portion MTb. The configuration of the second material layer portion MT2 and the vicinity thereof is the same as described above for the first material layer portion MT1. In the second material layer portion MT2 of each of the chalcogenide material layers MT, the concentration of the second element is higher in the vicinity of the boundary between the second material layer portion MT2 and the word line WL2.

Hereinafter, the first material layer portion MT1 and the vicinity thereof will be described, however, the second material layer portion MT2 and the vicinity thereof is substantially the same.

The memory cells each include the first material layer portion MT1 having a configuration as illustrated in FIG. 3A. Specifically, the memory cells each have a structure in which a variable resistance portion (also referred to as a storage portion) and a selection portion (also referred to as a switch portion) are connected in series. The layer portion MTa generally corresponds to the variable resistance portion, and the layer portion MTb generally corresponds to the selection portion.

The variable resistance portion selectively exhibits a low resistance state or a high resistance state. Specifically, when the variable resistance portion is crystalline, it exhibits a low resistance state. When the variable resistance portion is amorphous, it exhibits a high resistance state. When a voltage is applied between the word line WL1 and a bit line BL, a current flows to the first material layer portion MT1. When the current is gradually decreased, the variable resistance portion can crystallize (enter the low resistance state). When the current is abruptly decreased, the variable resistance portion will remain amorphous (enter the high resistance state). According to the changes in the particular resistance state (low resistance state or high resistance state) of the variable resistance portion, binary data can be stored.

When a voltage is applied between the word line WL1 and each of the bit lines BL, the second element is drawn toward the word line WL1. As a result, the portion corresponding to the layer portion MTb functions as a selector (switch) having nonlinear current-voltage (I-V) properties. When the applied voltage is zero or a direction of applied voltage is inverted, the second element is dispersed from a side of the word line WL1 to the bit lines BL and may lose the function of a selector.

When a predetermined voltage is applied between the word line WL1 and the bit lines BL, a portion corresponding to the layer portion MTb functions as a selector, and a current can be caused to flow to the variable resistance portion corresponding to the layer portion MTa. Thus, writing to or reading from the variable resistance portion can be carried out.

In this embodiment, the third material layer portion MT3 contains the first element, and the third material layer portion MT3 is an insulator, as described above. The first material layer portion MT1 and the second material layer portion MT2 are electrically insulated from each other by the third material layer portion MT3. Therefore, electrical insulation between different memory cells can be more certainly achieved between the first material layer portion MT1 and the second material layer portion MT2 that each function as memory cells. Accordingly, an electric field between the word lines WL and the bit lines BL tends to be concentrated at the first material layer portion MT1 and the second material layer portion MT2, and current can be caused to more efficiently flow to the first material layer portion MT1 and/or the second material layer portion MT2. Furthermore, thermal interference between adjacent word lines WL can be also reduced by the third material layer portion MT3. Therefore, a nonvolatile memory device having excellent properties and reliability can be made.

Figure 3B:
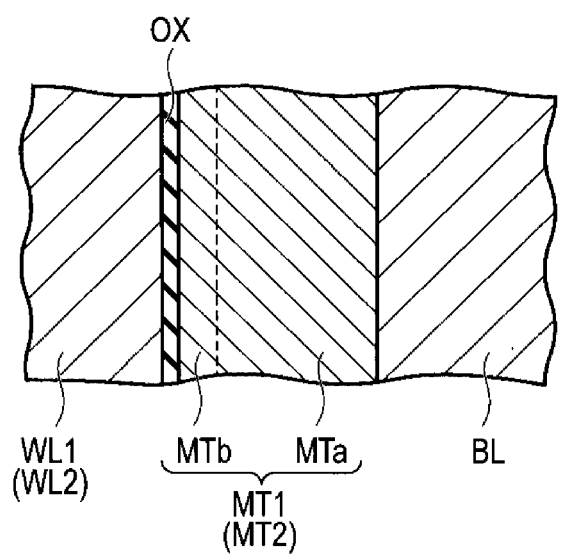
FIG. 3B is a cross-sectional view schematically illustrating as another example configuration of a first material layer portion (or a second material layer portion) of a chalcogenide material layer of a nonvolatile memory device according to an embodiment.

In the aforementioned embodiment, the first material layer portion MT1 is in direct contact with word line WL1 as illustrated in FIG. 3A. As illustrated in FIG. 3B, in other examples, an oxide layer OX may be disposed at the boundary between the first material layer portion MT1 and the word line WL1. In this case, the oxide layer OX is formed by partial oxidation of the word line WL1, that is, the oxide layer OX is formed as an oxide of a metal forming the word line WL1. The configuration of the second material layer portion MT2 and the vicinity thereof is the same as above. That is, the oxide layer OX may also be disposed at the boundary between the second material layer portion MT2 and the word line WL2.

Next, a method for manufacturing the nonvolatile memory device according to an embodiment will be described with reference to FIGS. 4 and 5.

Figure 4:
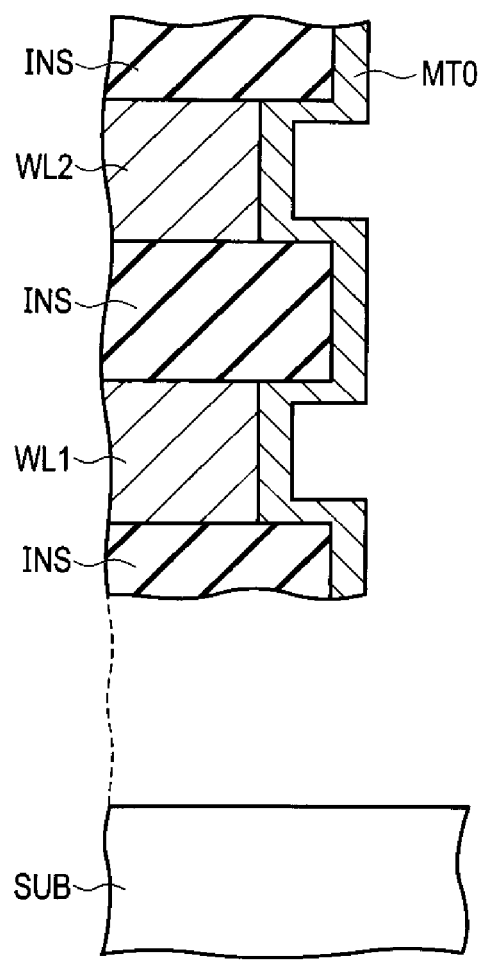
FIG. 4 and FIG. 5 depict a cross-sectional view schematically of a portion of a nonvolatile memory device during manufacturing processes according to an embodiment.

In a process stage depicted in FIG. 4, an insulating layer and a conductive layer for word lines have been alternately stacked. Subsequently, the insulating layers and the conductive layers are patterned, and the patterned conductive layers are recessed from an outer edge of the insulating layer(s). As a result, a stacked structure having the insulating layers INS and the word lines WL (in the drawings, only the word lines WL1 and WL2 are illustrated) is obtained. Subsequently, a chalcogenide material layer MT0 is formed conformally along a side surface of this stacked structure.

Figure 5:
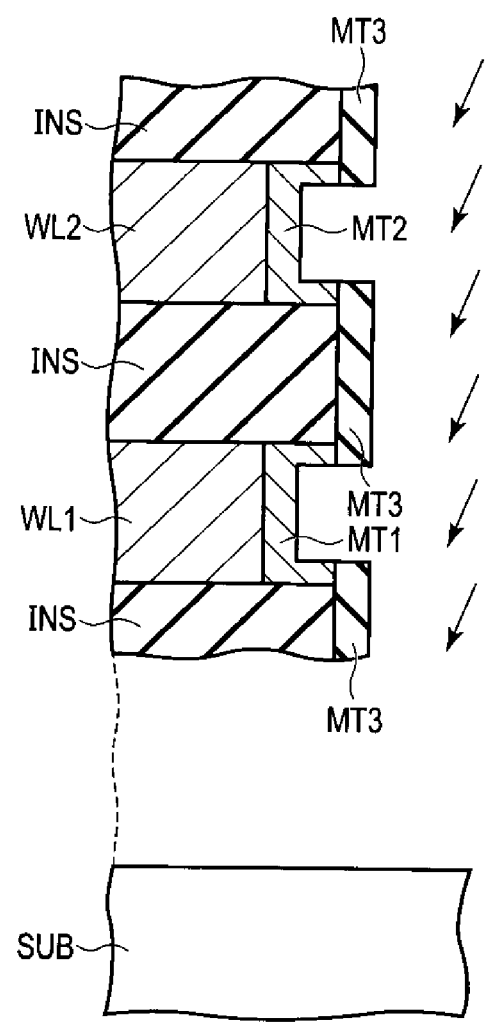

As illustrated in FIG. 5, the chalcogenide material layer MT0 obtained by the processing associated with FIG. 4 is then subjected to ion implantation of the first element from an oblique (angled) direction. By implantation of ions from an oblique direction, the ions can be implanted only (or at least substantially so) into the third material layer portion MT3. That is, the oblique ion implantation does not implant ions substantially into the first material layer portion MT1 or the second material layer portion MT2. Where the ions are implanted into the chalcogenide material layers, a chemical bond is cleaved, resulting in a more electrically insulating material. Thus, the third material layer portion MT3 can be an insulator.

After this processing of FIG. 5, the bit lines BL are formed on the side surface of the chalcogenide material layers MT to obtain the structure as illustrated in FIG. 2.

According to the manufacturing method of this embodiment, electrical insulation between adjacent memory cells can be obtained by converting the third material layer portion MT3 of each of the chalcogenide material layers through ion implantation into insulating material without any etching or removal of any portions of the chalcogenide material layers. Therefore, damage to a memory cell region (a region corresponding to the first material layer portion MT1 or the second material layer portion MT2) that might occur in an etching process or the like can be avoided, and any resulting decrease in the function of the memory cell region can be prevented. Furthermore, a process complexity can be reduced since the etching process need not be incorporated into the manufacturing process flow.

In this manufacturing method, the third material layer portion MT3 is made to be an insulator through ion implantation. However, in other examples, instead of ion implantation, plasma doping may be carried out.

Next, a modification will be described. In general, the basic matters are the same as those of the previously described embodiment. Therefore, repeated description of those basic matters is omitted.

Figure 6:
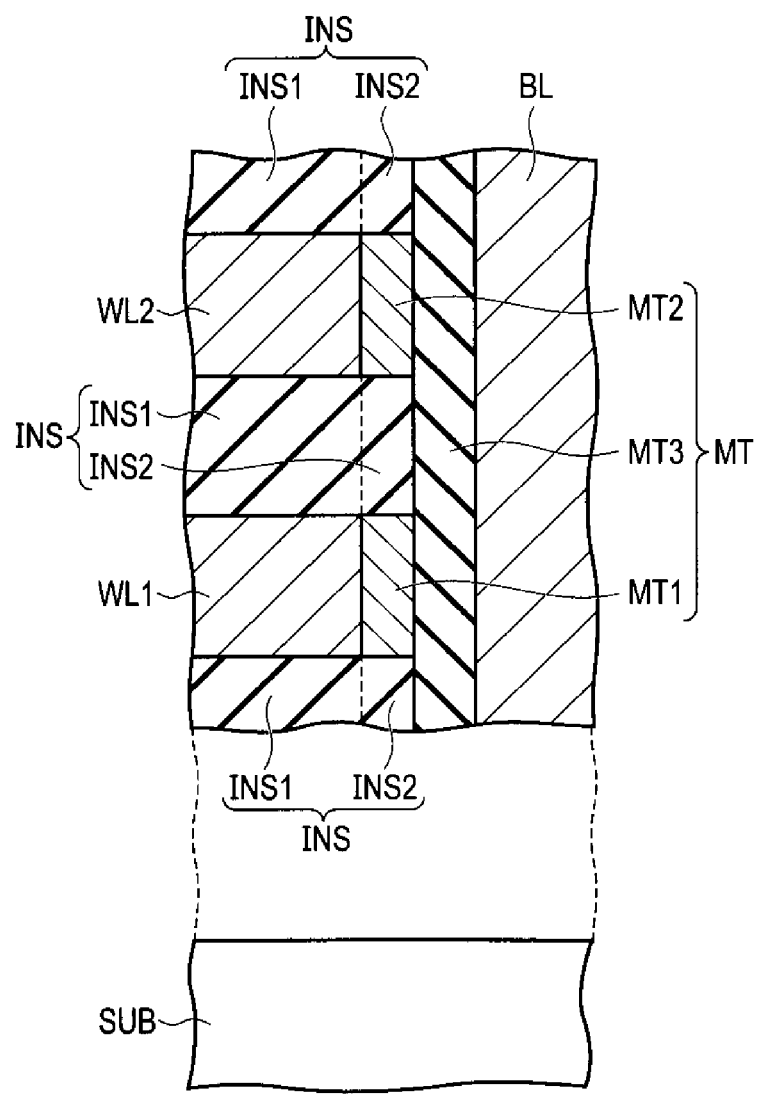
FIG. 6 is a cross-sectional view schematically illustrating aspects of a nonvolatile memory device according to a modification of an embodiment.

FIG. 6 is a cross-sectional view schematically illustrating a part of a configuration of a nonvolatile memory device according to a modification of an embodiment.

In the previous embodiment, the chalcogenide material layers MT are provided conformally along the side surface of a stacked structure including the word line WL1, the word line WL2, and the insulating layers INS. In this modification, the chalcogenide material layers MT are not provided conformally over the side surface of the stacked structure. In this modification, the third material layer portion MT3 includes, in addition to the portion disposed between the bit lines BL and the insulating layers INS, a portion disposed between the bit lines BL and the first material layer portion MT1 and a portion disposed between the bit lines BL and the second material layer portion MT2. More specifically, in this modification, the third material layer portion MT3 is formed along the side surfaces of the first material layer portion MT1, the insulating layers INS, and the second material layer portion MT2 so as to have an approximately uniform thickness.

Figure 7:
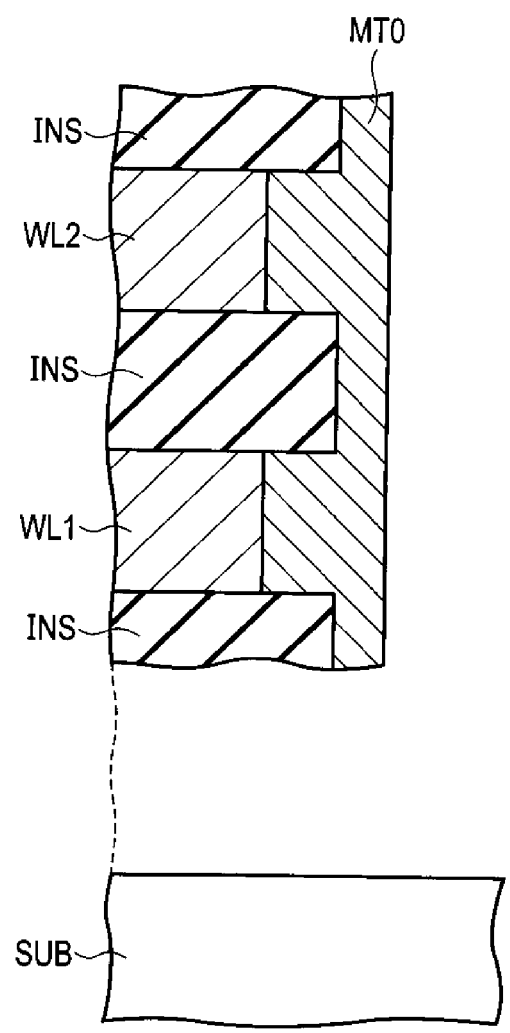
FIG. 7 is a cross-sectional view for schematically illustrating aspects of a method for manufacturing a nonvolatile memory device according to a modification of an embodiment.
Figure 8:
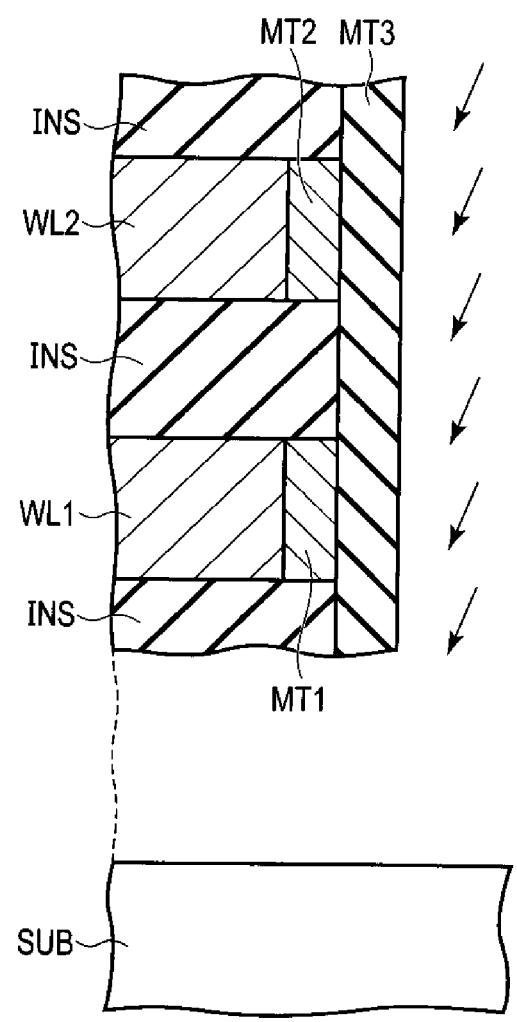
FIG. 8 is a cross-sectional view for schematically illustrating aspects of a method for manufacturing a nonvolatile memory device according to a modification of an embodiment.

FIGS. 7 and 8 are a cross-sectional view schematically illustrating as another example a method for manufacturing the nonvolatile memory device according to this modification.

In a process stage depicted in FIG. 7, a stacked structure including the insulating layers INS and recessed word lines WL (word lines WL1 and WL2) has been formed in the same manner as in the previous embodiment. Subsequently, a chalcogenide material layer MT0 is formed on a side surface of this stacked structure. The chalcogenide material layer MT0 in this modification is formed so that the outer side surface of the chalcogenide material layer MT0 is approximately flat.

As illustrated in FIG. 8, the chalcogenide material layer MT0 obtained according to the processing associated with in FIG. 7 is then subjected to ion implantation of the first element from an oblique direction. As such, the ions are implanted substantially only into the third material layer portion MT3 and are not substantially implanted into the first material layer portion MT1 and the second material layer portion MT2. The ion implantation energy can be adjusted to limit implantation depths. Through this ion implantation process, the third material layer portion MT3 can be made an insulator in a manner similar to that as described in the previous embodiment.

After the processing associated with FIG. 8, the bit lines BL are formed on the side surface of the chalcogenide material layers MT to obtain the structure as illustrated in FIG. 6.

Figure 9:
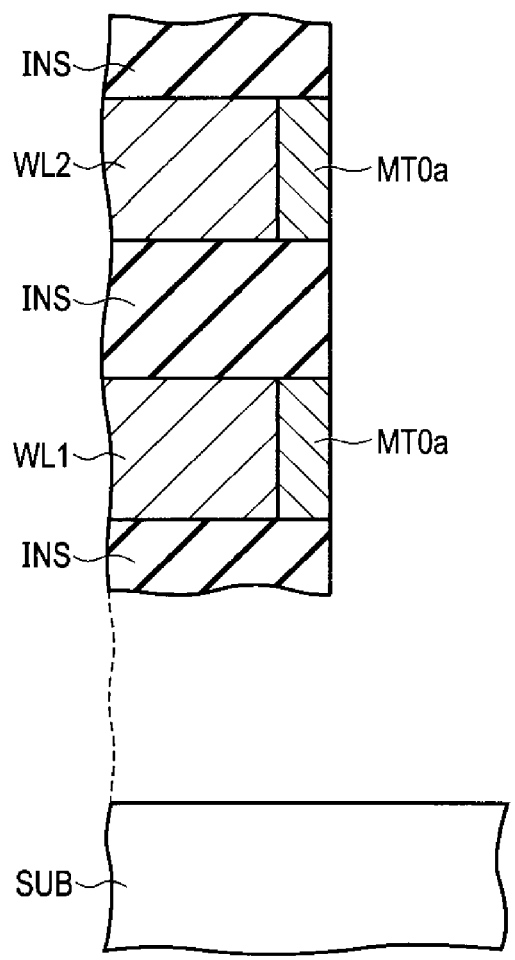
FIG. 9 is a cross-sectional view schematically illustrating aspects of another example of a method for manufacturing a nonvolatile memory device according to a modification of an embodiment.
Figure 10:
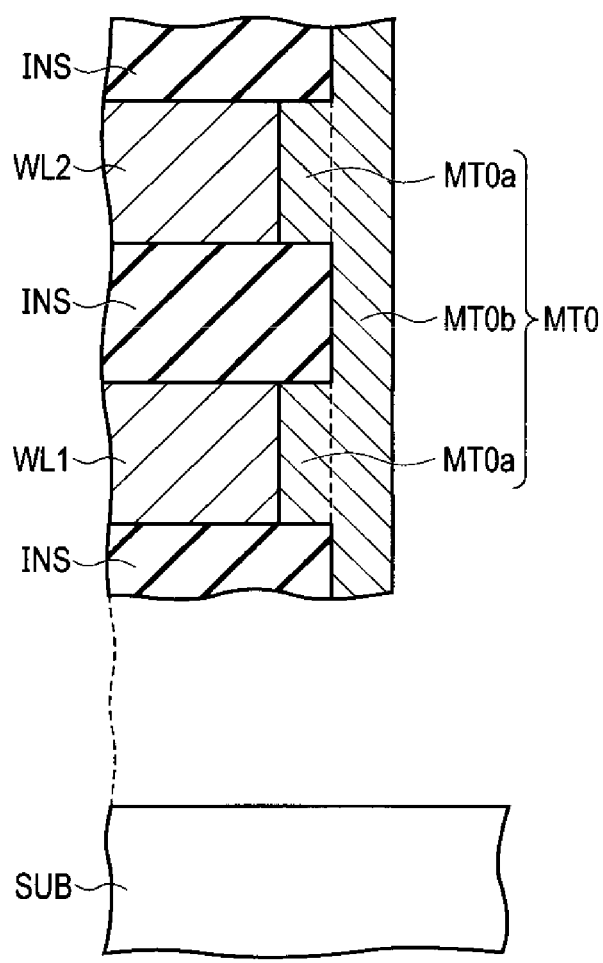
FIG. 10 is a cross-sectional view schematically illustrating aspects of another example of a method for manufacturing a nonvolatile memory device according to a modification of an embodiment.

In the manufacturing method of the above examples, the chalcogenide material layer MT0 is formed by performing a single film formation process. As illustrated in FIGS. 9 and 10, the chalcogenide material layer MT0 may also be formed by performing multiple film formation processes.

In a process in FIG. 9, a stacked structure including the insulating layers INS and recessed word lines WL (word lines WL1 and WL2) is formed in the same manner as in the above-described embodiment. In this example, a chalcogenide material layer MT0a is then formed on side surfaces of only the recessed word lines WL1 and WL2.

Next, a chalcogenide material layer MT0b is formed on side surfaces of the chalcogenide material layer MT0a and the insulating layers INS as illustrated in FIG. 10. Thus, the full chalcogenide material layer MT0 is obtained by a two-step film formation processing.

Subsequent processing is the same as the processing associated with FIG. 8. The third material layer portion MT3 is converted to insulator through ion implantation. The bit lines BL are then formed to obtain a structure similar to that illustrated in FIG. 6.

In this modification, the third material layer portion MT3 is also an insulator as described above. Therefore, the first material layer portion MT1 and the second material layer portion MT2 can be electrically insulated from each other, and the same effect as that in the above-described embodiment can be obtained.

In this modification, the third material layer portion MT3 covers the first material layer portion MT1 and the second material layer portion MT2. Therefore, even when the thickness of the first material layer portion MT1 is different from that of the second material layer portion MT2 due to differences in processing, the doping depths of ions during insulating the third material layer portion MT3 through ion implantation or plasma doping can be made more uniform, and electrical characteristic fluctuation can be reduced. In this modification, the adhesion of the bit lines BL can also be improved by the continuous presence of third material layer portion MT3, and the manufacturing processing can be facilitated.

While certain embodiments have been described, these embodiments have been presented by way of example only, and are not intended to limit the scope of the present disclosure. Indeed, the novel embodiments described herein may be embodied in a variety of other forms; furthermore, various omissions, substitutions and changes in the form of the embodiments described herein may be made without departing from the spirit of the present disclosure. The accompanying claims and their equivalents are intended to cover such forms or modifications as would fall within the scope and spirit of the present disclosure.

What is claimed is:

1. A nonvolatile memory device, comprising:
   a first wiring extending in a first direction;
   a second wiring extending in a second direction that intersects with the first direction;
   a third wiring extending in the second direction and spaced from the second wiring in the first direction;
   an insulating layer including a first portion between the second wiring and the third wiring in the first direction and a second portion protruding from the first portion in a third direction beyond ends of the second and third wirings in the third direction, the third direction intersecting with the first and second directions; and
   a chalcogenide layer between the first wiring and the second wiring, between first wiring and the third wiring, and between the first wiring and insulating layer, wherein
   the chalcogenide layer includes a first layer portion between the first wiring and the second wiring, a second layer portion between the first wiring and the third wiring, and a third layer portion between the first wiring and the insulating layer, a concentration of a first element in the third layer portion being higher than a concentration of the first element in the first layer portion and a concentration of the first element in the second layer portion.

2. The nonvolatile memory device according to claim 1, wherein a portion of the third layer portion is on the second layer portion, the portion of the third layer portion being between the first wiring and the second layer portion in the third direction.

3. The nonvolatile memory device according to claim 1, wherein
   the chalcogenide layer is a conformal layer,
   a portion of the third layer portion directly contacts the second layer portion, and
   the portion of the third layer portion is between the first wiring and the second layer portion in the third direction.

4. The nonvolatile memory device according to claim 1, wherein the third layer portion has a higher electrical resistivity than that of each of the first layer portion and the second layer portion.

5. The nonvolatile memory device according to claim 1, wherein the third layer portion is an electrical insulator.

6. The nonvolatile memory device according to claim 1, wherein a portion of the first wiring extends in the third direction past an interface position between the first layer portion and the third layer portion.

7. The nonvolatile memory device according to claim 1, wherein the chalcogenide layer is a conformal layer.

8. The nonvolatile memory device according to claim 1, further comprising:
   an oxide layer between the chalcogenide layer and the second wiring and between the chalcogenide layer and the third wiring.

9. The nonvolatile memory device according to claim 1, further comprising:
   a second insulating layer including a first insulating portion directly above the second wiring in the first direction and a second insulating portion protruding from the first insulating portion in the third direction beyond the end of the second wiring in the third direction, wherein
   a portion of the third layer portion extends in the third direction to be between the second portion of the insulating layer and the second insulating portion of the second insulating layer in first direction.

10. The nonvolatile memory device according to claim 1, wherein the chalcogenide layer comprises at least one first element selected from a group consisting of sulfur (S), selenium (Se), and tellurium (Te).

11. The nonvolatile memory device according to claim 1, wherein the first element is an element selected from a group consisting of argon (Ar), arsenic (As), phosphorus (P), boron (B), carbon (C), germanium (Ge), fluorine (F), nitrogen (N), and oxygen (O).

12. The nonvolatile memory device according to claim 1, wherein the chalcogenide layer contains a second element that is electrically conductive.

13. The nonvolatile memory device according to claim 12, wherein the second element is an element selected from a group consisting of aluminum (Al), silicon (Si), titanium (Ti), vanadium (V), chromium (Cr), manganese (Mn), iron (Fe), cobalt (Co), nickel (Ni), copper (Cu), zinc (Zn), yttrium (Y), zirconium (Zr), niobium (Nb), molybdenum (Mo), hafnium (Hf), tantalum (Ta), and tungsten (W).

14. The nonvolatile memory device according to claim 12, wherein,
   in the first layer portion of the chalcogenide layer, a concentration of the second element is higher at a first position near a boundary between the first layer portion and the second wiring than at a second position farther from the boundary than the first position in the third direction, and
   in the second layer portion of the chalcogenide layer, a concentration of the second element is higher at a third position near a boundary between the second layer portion and the third wiring than at a fourth position farther from the boundary than the third position in the third direction.

15. The nonvolatile memory device according to claim 1, further comprising:
   an oxide layer at a boundary between the first layer portion and the second wiring; and
   another oxide layer at a boundary between the second layer portion and the third wiring.

16. The nonvolatile memory device according to claim 1, wherein each of the first and second layer portions is in a first resistance state or in a second resistance state having a higher resistance than that of the first resistance state.

17. A nonvolatile memory array, comprising:
   a bit line extending in a first direction;
   a first word line extending in a second direction interesting the first direction;
   a second word line extending in the second direction, the second word line being above the first word line in the first direction;
   an insulator film between the first and second word lines in the first direction, the insulator film including a first portion directly between and contacting the first and second word lines and a second portion extending in a third direction from the first portion beyond ends of the first and second word lines, the third direction orthogonal to the first and second directions;
   a memory film having a first film portion between the bit line and the first word line, a second film portion between the bit line and the second word line, and a third film portion between the bit line and the insulator film, wherein
   the first film portion and the second film portion have a same dopant concentration level, and
   the third film portion has a dopant concentration level higher than the first and second film portions.

18. The nonvolatile memory array according claim 17, wherein
   the memory film is a chalcogenide material, and
   the dopant is an element selected from a group consisting of argon (Ar), arsenic (As), phosphorus (P), boron (B), carbon (C), germanium (Ge), fluorine (F), nitrogen (N), and oxygen (O).

19. The nonvolatile memory array according to claim 17, wherein the memory film is a conformal film.

20. The nonvolatile memory array according to claim 19, wherein
   a portion of the third film portion directly contacts the second film portion, and
   the portion of the third film portion is between the bit line and the second film portion in the third direction.

* * * * *